(12) United States Patent
Ballard et al.

(10) Patent No.: US 8,402,628 B2
(45) Date of Patent: Mar. 26, 2013

(54) APPARATUS, CARRIER, AND METHOD FOR SECURING AN ARTICLE FOR COATING PROCESSES

(75) Inventors: Shane P. Ballard, Louisville, CO (US); Edwin Jackson Little, Denver, CO (US)

(73) Assignee: Primestar Solar, Inc., Arvada, CO (US)

( * ) Notice: Subject to any disclaimer, the term of this patent is extended or adjusted under 35 U.S.C. 154(b) by 385 days.

(21) Appl. No.: 12/841,489

(22) Filed: Jul. 22, 2010

(65) Prior Publication Data

US 2012/0017410 A1      Jan. 26, 2012

(51) Int. Cl.
| | |
|---|---|
| B23P 11/00 | (2006.01) |
| B23Q 7/00 | (2006.01) |
| B25B 1/22 | (2006.01) |
| B05C 13/00 | (2006.01) |
| B05C 13/02 | (2006.01) |

(52) U.S. Cl. ............. 29/428; 118/500; 118/503; 29/559; 29/464; 29/466; 29/468; 269/71

(58) Field of Classification Search ................. 29/559, 29/464, 466, 468, 428; 118/500, 503; 269/43, 269/45, 228, 71, 75; 414/222.07, 225.01, 414/222.13, 226.01; 294/65
See application file for complete search history.

(56) References Cited

U.S. PATENT DOCUMENTS

| | | | | |
|---|---|---|---|---|
| 3,297,313 | A * | 1/1967 | Stevens | 269/71 |
| 5,022,636 | A * | 6/1991 | Swann | 269/43 |
| 5,685,060 | A * | 11/1997 | Tibbet | 29/559 |
| 6,328,808 | B1 * | 12/2001 | Tsai et al. | 118/729 |
| 6,519,827 | B1 * | 2/2003 | Hayashi et al. | 29/430 |
| 6,530,566 | B1 * | 3/2003 | DuVernay | 269/228 |
| 8,181,326 | B2 * | 5/2012 | Silliman et al. | 29/451 |
| 2009/0096143 | A1 * | 4/2009 | Wampler, II | 269/10 |
| 2011/0159200 | A1 * | 6/2011 | Kogure | 427/458 |
| 2012/0119528 | A1 * | 5/2012 | Herfert | 294/65 |

OTHER PUBLICATIONS

Glass Clip, Glass Clip Manufacturers & Suppliers; http://www.alibaba.com/showroom/Glass_Clip.html; pp. 1-6; accessed Oct. 6, 2009.

* cited by examiner

*Primary Examiner* — Essama Omgba
(74) *Attorney, Agent, or Firm* — Dority & Manning, P.A.

(57) ABSTRACT

An apparatus for securing an article, a carrier including the apparatus, and a method involving the apparatus are disclosed. The apparatus includes a base having a channel and a pivot post, an engagement member for selectively engaging the article, a rotatable actuation member having a pivot feature corresponding to the pivot post, and a positioning member secured to the base. The engagement member is slidably positionable in the channel of the base, the positioning member establishes travel limits for the rotatable actuation member, and the positioning member urges the engagement member toward the article. Rotation of the rotatable actuation member slides the engagement member along the channel of the base, thereby securing the article by the force provided by the positioning member.

20 Claims, 5 Drawing Sheets

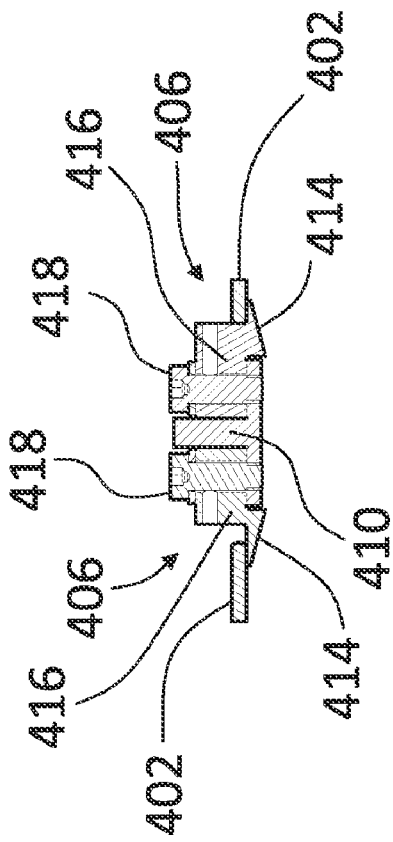

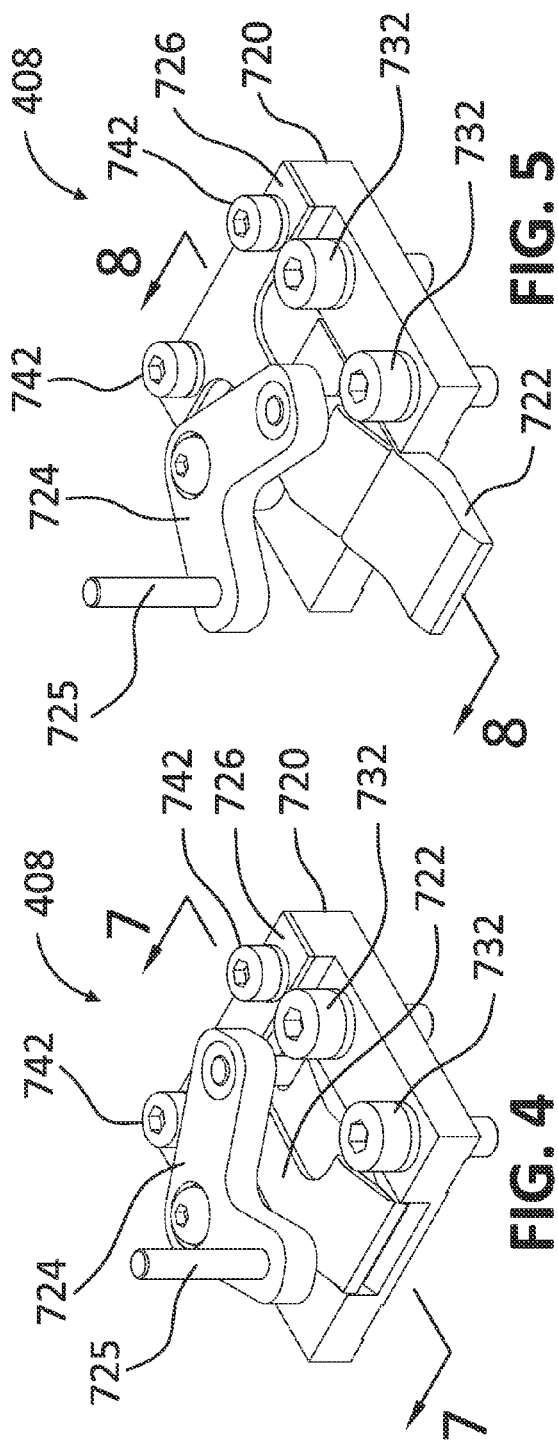
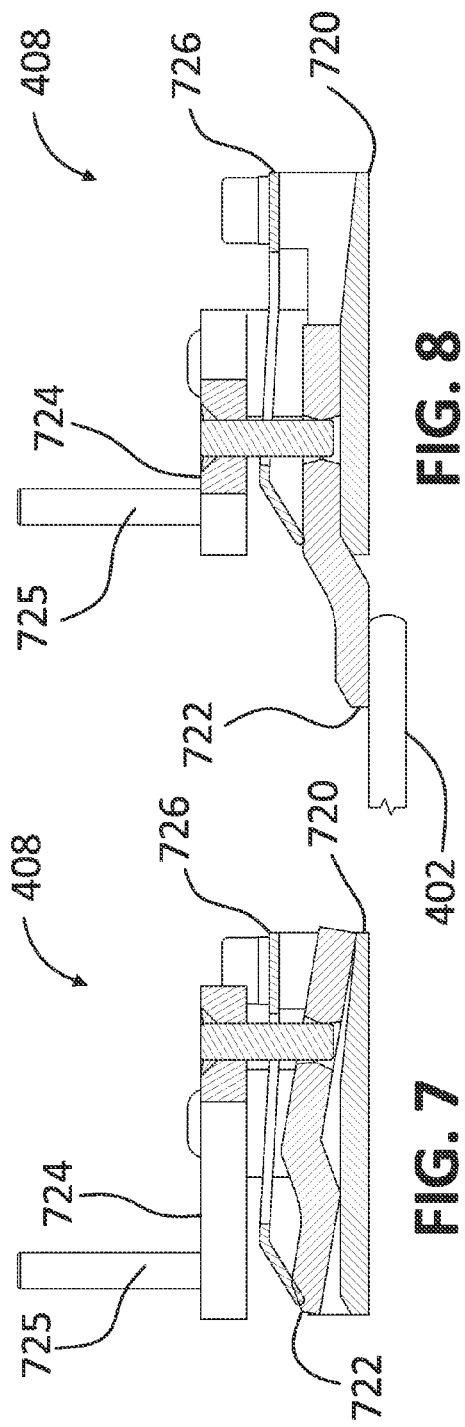

APPARATUS, CARRIER, AND METHOD FOR SECURING AN ARTICLE FOR COATING PROCESSES

FIELD OF THE INVENTION

The present disclosure is directed to an apparatus for securing an article, a carrier for securing an article, and a method of securing articles for coating processes.

BACKGROUND OF THE INVENTION

Generally, substrates (for example, glass) can fail by propagation of a crack from an edge or corner defect. Thus, edge or corner defects on substrates are undesirable. Avoiding the causation of edge and corner defects can, thus, improve the strength of the substrate by maintaining resistance to crack propagation and, thus, prevent fatal breakage. Thus, protection of the surface of the substrate is desirable.

During manufacturing processes, substrates may be mechanically moved. Mechanical movement of the substrate in more than one direction or manner can require additional process elements. For example, moving a substrate in a single direction (for example, a purely horizontal direction) can be achieved with certain process elements. Moving the substrate initially in one direction (for example, a purely vertical direction) and then in another direction (for example, the purely horizontal direction) may require different process elements. Moving the substrate in combined directions and/or manners (for example, angling or rotating the substrate) may require complex process elements. Reducing the number and complexity of process elements is desirable as it can decrease costs of a manufacturing system.

An apparatus for securing glass substrates, a carrier for securing glass substrates, and a method of securing glass substrates would be desired in the art.

BRIEF DESCRIPTION OF THE INVENTION

In an exemplary embodiment, an apparatus for securing an article includes a base having a channel and a pivot post, an engagement member for selectively engaging the article, a rotatable actuation member having a pivot feature corresponding to the pivot post, and a positioning member secured to the base. In the embodiment, the engagement member is slidably positionable in the channel of the base, the positioning member establishes travel limits for the rotatable actuation member, and the positioning member urges the engagement member toward the article. Rotation of the rotatable actuation member slides the engagement member along the channel of the base, thereby securing the article by the force provided by the positioning member.

In another exemplary embodiment, a carrier for securing an article includes at least two apparatuses positioned within a frame, the frame for securing the article, and a plurality of support pads positioned in the frame. Each apparatus includes a base having a channel and a pivot post, an engagement member for selectively engaging the article, the engagement member being slidably positionable in the channel of the base, a rotatable actuation member having a pivot feature corresponding to the pivot post, and a positioning member secured to the base, establishing travel limits for the rotatable actuation member, and providing force onto the engagement member, urging the engagement member toward the article. In the embodiment, rotation of the rotatable actuation member slides the engagement member along the channel of the base thereby securing the article by the force provided by the positioning member via the engagement member. The frame and the plurality of support pads restrain movement of the article in at least four directions. Additionally, rotation of the rotatable actuation member of one or more of the at least two apparatuses restrains movement of the article in at least a fifth and sixth direction.

In another exemplary embodiment, a method of securing an article includes providing an apparatus, actuating a rotatable actuation member of the apparatus, and rotating the rotatable actuation member to slide an engagement member of the apparatus in a channel of the apparatus to engage the article. The positioning member urges the engagement member toward the article. The apparatus includes a base having the channel and a pivot post, an engagement member for selectively engaging the article, the engagement member being slidably positionable in the channel of the base, a rotatable actuation member having a pivot feature corresponding to the pivot post, and a positioning member secured to the base, establishing travel limits for the rotatable actuation member, and providing force onto the engagement member, urging the engagement member toward the article. Rotation of the rotatable actuation member slides the engagement member in the channel of the base thereby securing the article by the force provided by the positioning member.

BRIEF DESCRIPTION OF THE DRAWINGS

FIG. 2 is a sectioned view along 2-2 of FIG. 1.

FIG. 3 is a sectioned view along 3-3 of FIG. 1.

FIG. 4 is a perspective view of an exemplary embodiment of an apparatus for securing glass positioned for insertion of glass.

FIG. 5 is a perspective view of an exemplary embodiment of an apparatus for securing glass positioned for securing glass.

FIG. 7 is a sectioned view of FIG. 4 according to line 7-7.

FIG. 8 is a sectioned view of FIG. 5 according to line 8-8.

Wherever possible, the same reference numbers will be used throughout the drawings to represent the same parts.

DETAILED DESCRIPTION OF THE INVENTION

Provided is an apparatus for securing glass substrates, a carrier for securing articles, such as glass substrates, and a method of securing articles, such as glass substrates. Embodiments of the present disclosure may protect glass from being improperly released, may include robotic positioning of the glass, may include decreased freedom of movement for the glass, and/or may secure the glass with unidirectional movement of the glass.

In the disclosure, when a layer is being described as "adjacent," "on," or "over" another layer or substrate, it is to be understood that the layer can either be directly in contact or that another layer or feature can intervene.

Figure 1:
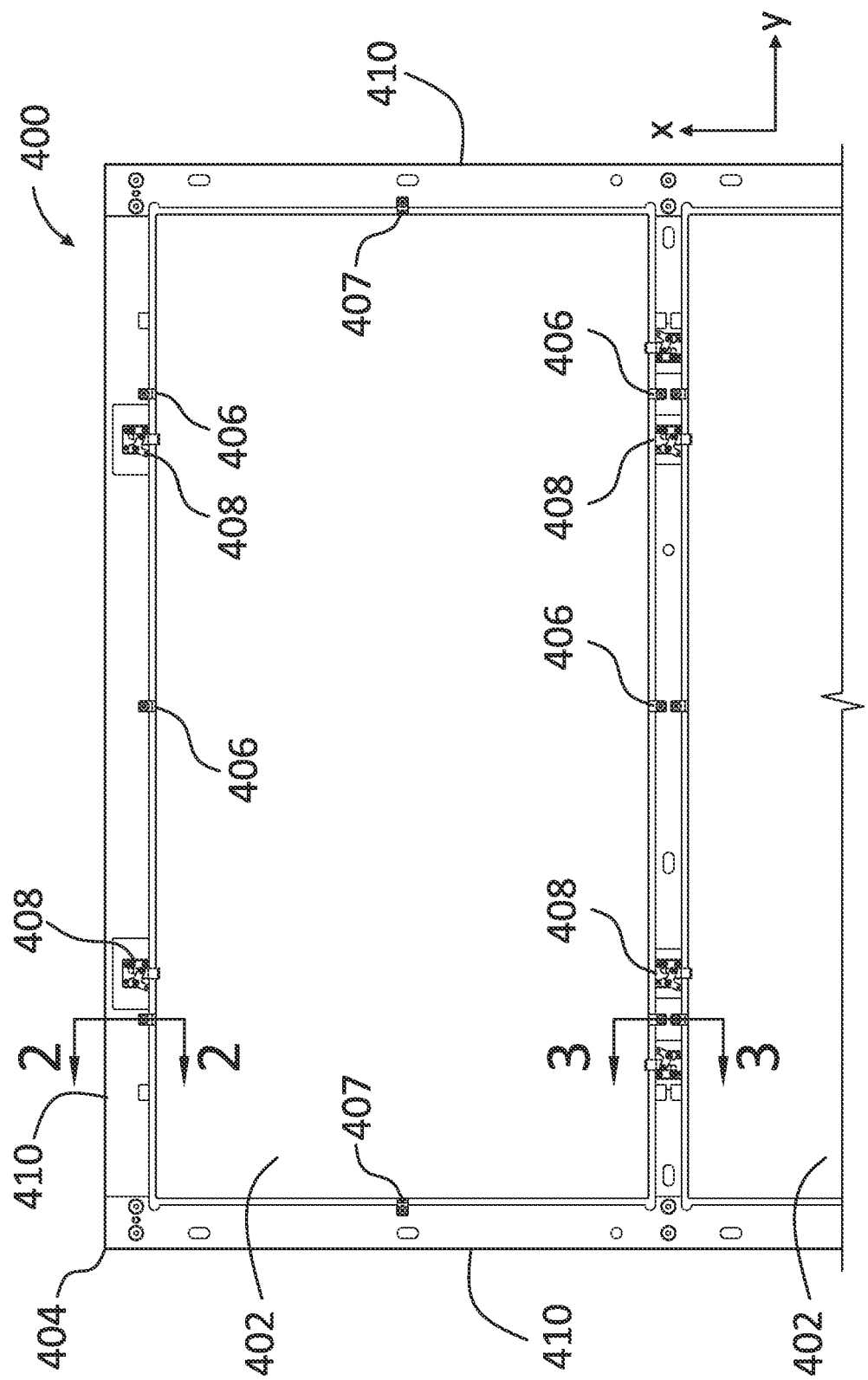
FIG. 1 is a transverse view of an exemplary embodiment of a carrier for securing glass.

FIG. 1 shows a carrier 400 for securing glass 402. Carrier 400 includes a frame 404, support pad(s) 406 positioned within frame 404, and at least one apparatus 408 for securing glass 402. In one embodiment, at least two apparatuses 408 are included. Glass 402 may be a superstrate, an encapsulating glass, or any other suitable glass used to form a photovoltaic module. Frame 404 is formed by two sets of substantially parallel members 410 forming a rectangle. In some embodiments, frame 404 may be any other suitable geometry (for example, circular, oval-shaped, square rectangular, etc.). In one embodiment, the geometry includes at least two substantially parallel members 410 (for example, as in a square, rectangle, hexagon, etc.). In other embodiments, frame 404 may be formed by geometries without parallel members 410 (for example, circles, ovals, etc.). Frame 404 may be continuous in forming its geometry or may be discontinuous with several smaller portions forming parallel members 410. Parallel members 410 may be of any suitable material capable of resisting heat associated with processes, for example, physical vapor deposition or chemical vapor deposition. In one embodiment, material in parallel members 410 may be selected to reduce expansion and contraction of parallel members 410. For example, the material may be tungsten, tungsten alloy, molybdenum, molybdenum alloys, Inconel alloys, steel, stainless steel, or titanium. While the above has been described with respect to securing glass 402, the disclosure is not so limited and may include other articles, such as polymers, ceramics or metals.

FIG. 2 is a sectional view of frame 404 taken in direction 2-2 in FIG. 1. FIG. 3 shows a sectional view of frame 404 taken in direction 3-3 in FIG. 1. Frame 404 is configured to secure glass 402 upon glass 402 being positioned on pad(s) 406 and apparatuses 408 attached to frame 404. Frame 404 may include pad(s) 406 for securing one piece of glass 402 (see FIG. 2). Frame 404 may include pad(s) 406 for securing two pieces of glass 402 (see FIG. 3) (the second piece being partially shown). Pad(s) 406 includes first portion 414 and second portion 416. Glass 402 can be positioned within frame 404 by being positioned against first portion 414 of pad(s) 406 and aligned with second portion 416 of pad(s) 406. Frame 404 also includes stops 407, which include a protrusion or other feature to prevent or restrain movement of the glass 402 in the Y direction.

Upon positioning glass 402 against first portion 414 of pad(s) 406, glass 402 is secured in at least four directions. For example, referring to FIG. 1, pad(s) 406 and stop(s) 407 may secure (or limit the movement) glass 402 within the positive X direction (shown in FIGS. 1-3) and the negative X direction and the positive Y direction (shown in FIG. 1) and the negative Y direction. In one embodiment, pad(s) 406 may further secure glass 402 within a negative Z direction while remaining unsecured in the positive Z direction (shown in FIGS. 2 and 3). In one embodiment, pad(s) 406 and stop(s) 407 may secure glass 402 in the positive and negative X direction, the positive and negative Y direction, and the negative Z direction. Pad(s) 406 and stop(s) 407 may secure glass 402 while permitting movement associated with expansion of glass 402 during increases in temperature.

Frame 404 may additionally or alternatively include apparatuses 408 for securing glass 402. A second apparatus 408 may be positioned on another parallel member 410 of frame 404 in comparison to a first apparatus 408. More apparatuses 408 or fewer apparatuses 408 may be included around a perimeter of frame 404. The number of apparatuses 408 included may correspond to the geometry of frame 404 and/or the number of pads 406 included. In one embodiment, apparatuses 408 may be positioned proximal to pad(s) 406, which may reduce the stress imparted to glass 402. Upon being actuated, apparatuses 408 may secure glass 402 in an additional direction (for example, the positive Z direction). In one embodiment, upon engaging apparatuses 408, glass 402 may be secured in all directions.

Figure 6:
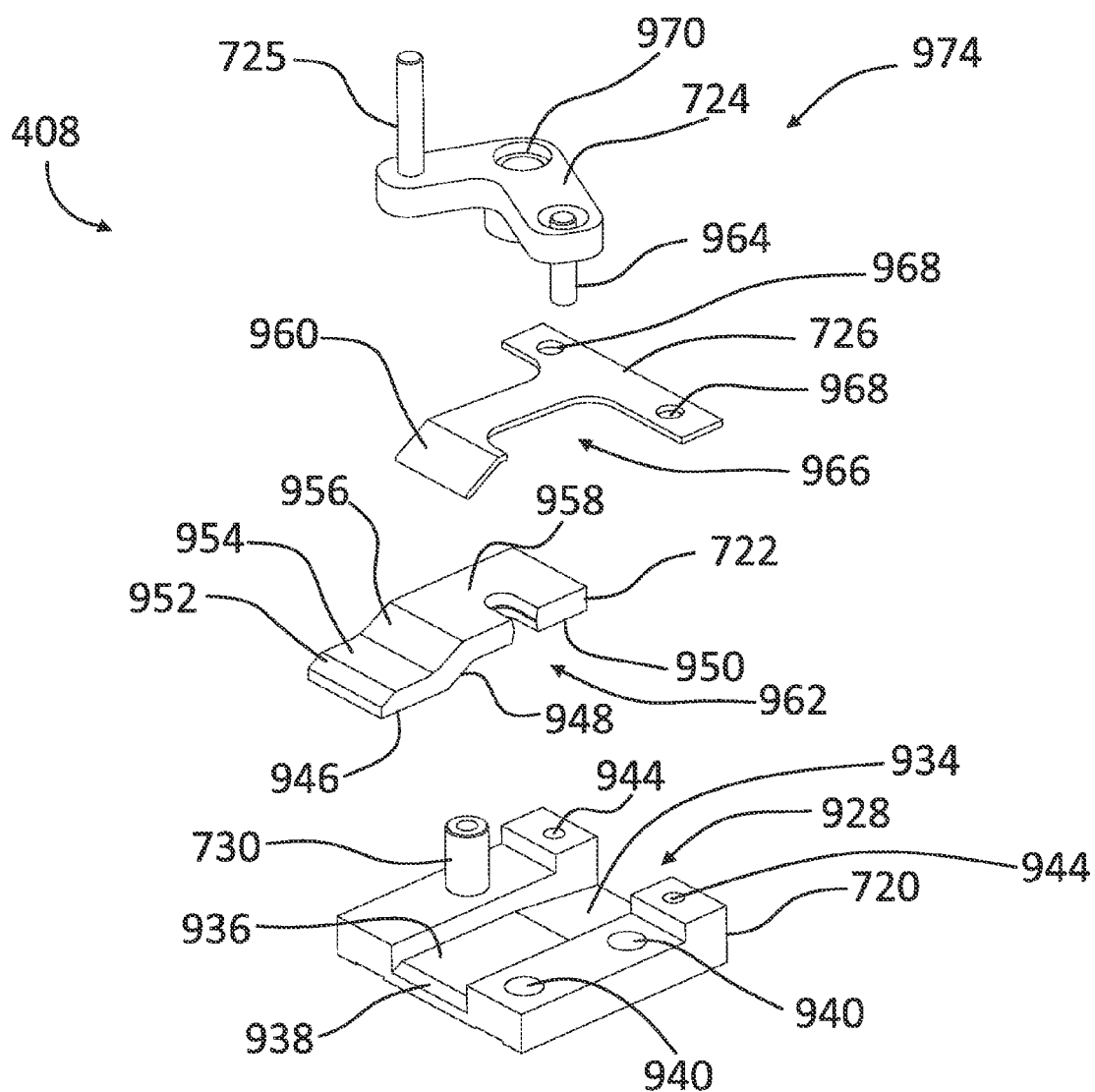
FIG. 6 is an exploded perspective view of an apparatus according to an exemplary embodiment.

FIGS. 4 and 7 show apparatus 408 in a non-actuated position. FIGS. 5 and 8 show apparatus 408 in an actuated position. FIG. 6 shows an exploded view of apparatus 408. As seen in FIG. 4, apparatus 408 includes a base 720, an engagement member 722, a rotatable actuation member 724, and a positioning member 726. Actuation of rotatable actuation member 724 from the position shown in FIGS. 4 and 7 slides engagement member 722 along base 720 thereby securing glass 402 as positioning member 726 urges engagement member 722 to maintain the position shown in FIGS. 5 and 8. Apparatus 408 can, thus, secure and release glass 402 upon actuation and retraction. In one embodiment, a plurality of apparatuses 408 can be sequentially or concurrently actuated, thus, permitting additional securing of glass 402. Such actuation may be accomplished by any suitable method, including but not limited to mechanical linkages, computer controlled actuators, robots, and/or manually. As shown in FIGS. 4-8, an actuation pin 725 may be positioned for robotic actuation. For example, actuation pin 725 may be extended and configured for access from a robot or by other external means.

Base 720 includes a channel 928 (shown in FIG. 6) and a pivot post 730 (shown in FIG. 6). Base 720 may be secured to frame 404 of carrier 400 by fasteners 732 (shown in FIGS. 4-5) being positioned within holes 940. Positioning member 726 may be secured to base 720 by fasteners 742 (shown in FIGS. 4-5) being positioned through holes 968 and within holes 944 (shown in FIG. 6). Fasteners 732 and fasteners 742 are accessible from the same direction, thereby making access easier for assembly and/or adjustment of apparatus 408 easier. Fasteners 732 are positioned along channel 928 opposite pivot post 730. Such positioning permits apparatus 408 to be smaller in size. Fasteners 742 are positioned on opposite sides of channel 928, providing substantially symmetrical mounting of positioning member 726, which applies centered loading upon engagement member 722.

Base 720 may be made of any material suitable for temperature increases associated with various vapor deposition processes. For example, base may be made of aluminum. Portions of base 720, for example, pivot post 730 and/or channel 928, may include additional or alternative materials. For example, base 720 may include materials with a predetermined coefficient of friction between it and engagement member 722 thereby controlling the force required for sliding engagement member 722 within channel 928.

As shown in FIG. 6, channel 928 includes a first portion 934 at an angle with respect to a second portion 936. Channel 928 further includes a third portion 938 at an angle other than zero degrees with respect to second portion 936. The size and angles of these portions may affect the amount of force for actuating rotatable actuation member 724 and may enable smooth operation of apparatus 408. Pivot post 730 may be configured for receiving rotatable actuation member 724, thereby permitting pivoting or rotation about an axis. In other embodiments, other suitable devices that permit the pivoting motion may be used.

Referring again to FIG. 6, engagement member 722 selectively engages glass 402 (see FIG. 1) and is slidably positionable in channel 928 of base 720. Engagement member 722 may be made of poly ether ether ketone (PEEK), vespel, celazole, or any suitable material permitting engagement member 722 to slide (for example, with a coefficient of friction of 0.4 or lower) within channel 928, resist high temperatures, and/or resisting scratching on the glass. In one embodiment, the material of engagement member 722 may be selected to reduce or eliminate an increase in the coefficient of friction due to softening, deforming, and/or swelling that may be caused by high temperatures. Additionally or alternatively, the thermal conductivity of the material forming engagement member 722 may be lower than other portions of apparatus 408. It is desirable for engagement member 722 to have a low thermal conductivity (for example, less than about 10 W/m·k). In one embodiment, engagement member 722 may be configured to prevent thermal shock (cold or hot) when contacting glass, thereby preventing glass breakage.

Engagement member 722 has a width that corresponds to the width of channel 928. For example, the width of engagement member 722 is slightly smaller than channel 928 and may include any suitable dry lubricants not out-gassing or chemically affecting the coating process. For example, the dry lubricant may be $MoS_2$ (molybdenum disulfide) or graphite.

As shown in FIG. 6, proximal to channel 928, engagement member 722 includes an engagement surface 946, a linking surface 948, and a sliding surface 950. Engagement surface 946 may be substantially planar and positionable to selectively abut glass 402 upon apparatus 408, the engagement member 722 being urged by actuation through rotation of rotatable actuation member 724. Engagement surface 946 may include additional features for protecting glass 402. For example, engagement surface 946 may include material such as fine wire mesh or high temperature soft plastic or rubber and/or features less likely to mar or scratch the surface of glass 402. Additionally or alternatively, engagement surface 946 may include material and/or features for substantially evenly distributing the force upon glass 402 when apparatus 408 is actuated to secure glass 402.

Linking surface 948 extends from engagement surface 946 to sliding surface 950. Linking surface 948 is at an angle with respect to both engagement surface 946 and sliding surface 950. The angle of linking surface 948 corresponds with the angle of third portion 938 of channel 928 and is positioned at an angle sufficient to establish and maintain the extended positioning of engagement member 722 when apparatus 408 is actuated to secure glass 402.

Sliding surface 950 slides along first portion 934 and second portion 936 of channel 928 upon actuation of apparatus 408 to secure glass 402. Upon apparatus 408 being fully actuated (for example, fully rotating rotatable actuation member 724), sliding surface 950 is positioned against channel 928 with substantially all of sliding surface 950 contacting channel 928. In one embodiment, upon apparatus 408 being fully actuated, a detenting effect can be achieved. As used herein, the term "detenting effect" refers to a physical effect involving the force of positioning member 726 upon engagement member 722 in response to the actuation of rotatable actuation member 724 reaching a predetermined point. The predetermined point may be any suitable point. For example, the predetermined point may be near full actuation and the physical effect may be a click sound. In another embodiment, the detenting effect may be produced upon retraction of engagement member 722.

Referring again to FIG. 6, distal from channel 928, engagement member 722 may include a leading surface 952, a surface 954 corresponding to (for example opposite from) engagement surface 946, a surface 956 corresponding to linking surface 948, and a surface 958 corresponding to sliding surface 950. Leading surface 952 may be angled with respect to surface 954 thereby providing a detent mechanism when acting with positioning member 726 to secure engagement member 722 upon rotatable actuation member 724 being actuated by rotation to release glass 402. An increased angle of leading surface 952 and an increased angle of a corresponding portion 960 of positioning member 726 may increase the amount of force required to actuate rotatable actuation member 724 to secure glass 402. A decreased angle of leading surface 952 and a decreased angle of corresponding portion 960 may not detain engagement member 722 to a desired level. In one embodiment, the angle of leading surface 952 is substantially the same as surface 956 corresponding to linking surface 948 and a corresponding portion 960 of positioning member 726.

Surface 958 of engagement member 722 also includes a slot 962 configured for receiving a pin 964 of rotational actuation member 724. Upon rotational actuation member 724 being actuated to secure glass 402, pin 964 selectively urges engagement member 722 toward glass 402. Upon rotational actuation member 724 being actuated to release glass 402, pin 964 selectively urges engagement member 722 away from glass 402. The urging of engagement member 722 may be constrained by a recess 966 in positioning member 726 by restraining movement of pin 964 beyond predetermined limits in one or more direction.

Positioning member 726 is secured to base 720 by fasteners (not shown) extending through openings 968 into holes 944. Positioning member 726 provides alignment by establishing travel limits for rotatable actuation member 724 and provides force onto engagement member 722 toward glass 402. Positioning member 726 includes corresponding portion 960 for providing force onto engagement member 722. In one embodiment, positioning member 726 may be made of a tempered steel to prevent permanent deformation and maintain the capability to provide force onto engagement member 722 in high temperature conditions. For example, positioning member 726 may be formed of 17-7 PH stainless steel or another suitable material having similar hardness to avoid relaxation. Additionally or alternatively, thickness of positioning member 726 may be preselected such that the limit corresponds to a predetermined amount of force to actuate rotatable actuation member 724.

Rotatable actuation member 724 includes a pivot feature 970 corresponding to pivot post 730. Pivot feature 970 may be a cylinder slightly larger than the diameter of pivot post 730. Rotatable actuation member 724 also includes actuation pin 725. Actuation pin 725 is configured for actuating rotatable actuation member 724. Pin 964 and actuation pin 725 may be pressed into and welded to an arm 974 thereby forming rotatable actuation member 724. Arm 974 may be shaped with perpendicular portions or any other suitable geometry permitting actuation of actuation pin 725 to result in pin 964 selectively urging engagement member 722.

Figure 9:
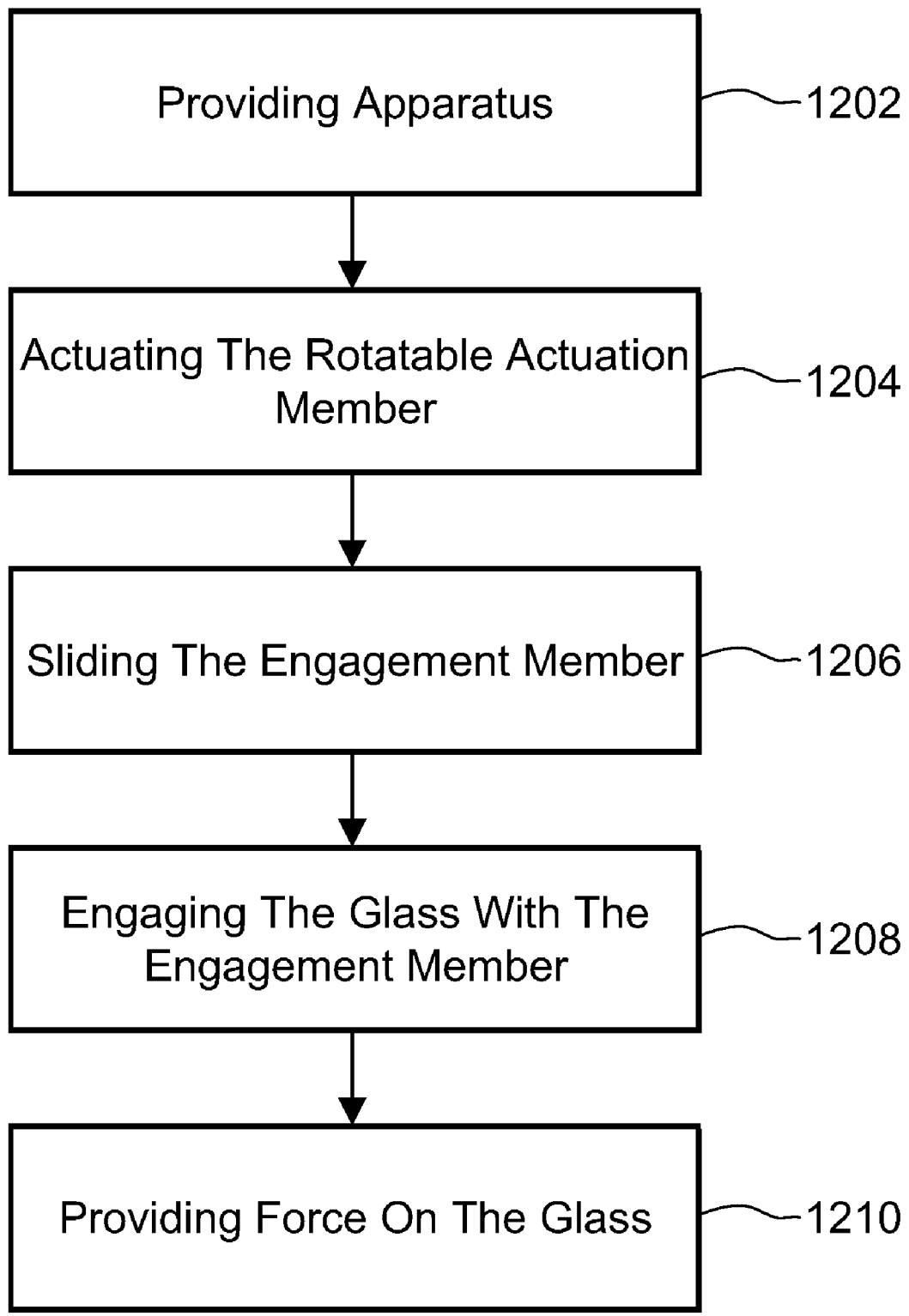
FIG. 9 is a method of securing glass.

As shown in FIG. 9, an exemplary method of securing glass includes providing any suitable apparatus (box 1202), permitting actuation of rotatable actuation member 724 to slide an engagement member 722 in a channel 928 of a base 720 to secure the glass 402, actuating the rotatable actuation member 724 (box 1204), sliding the engagement member in the channel (box 1206), engaging the glass with the engagement member 722 (box 1208), and providing force on the glass (box 1210) from the positioning member 726 via the engagement member 722, thereby securing the glass 402.

While the disclosure has been described with reference to a preferred embodiment, it will be understood by those skilled in the art that various adjustments may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

The invention claimed is:

1. An apparatus for securing an article, the apparatus comprising:
a base having a channel and a pivot post;
an engagement member for selectively engaging the article, the engagement member being slidably positionable in the channel of the base;
a rotatable actuation member having a pivot feature corresponding to the pivot post; and
a positioning member secured to the base, establishing travel limits for the rotatable actuation member, and providing force onto the engagement member, urging the engagement member toward the article; and
wherein rotation of the rotatable actuation member slides the engagement member along the channel of the base thereby securing the article by the force provided by the positioning member.

2. The apparatus of claim 1, wherein the rotatable actuation member further comprises a first pin and a second pin, the first pin being configured for actuation and the second pin being configured for urging the engagement member upon the first pin being actuated.

3. The apparatus of claim 2, wherein the first pin is of sufficient length for external actuation.

4. The apparatus of claim 2, wherein the first pin and the second pin are pressed into and welded to the rotatable actuation member.

5. The apparatus of claim 1, wherein the actuation of the rotatable actuation member produces a detenting effect.

6. The apparatus of claim 5, wherein reverse rotation of the actuated rotatable actuation member slides the engagement member in the channel of the base away from the article thereby releasing the article.

7. The apparatus of claim 1, wherein the engagement member has thermal conductivity of less than about 10 W/mk.

8. A carrier for securing an article, the carrier comprising:
at least two apparatuses positioned within the frame, each apparatus comprising:
a base having a channel and a pivot post; an engagement member for selectively engaging the article, the engagement member being slidably positionable in the channel of the base;
a rotatable actuation member having a pivot feature corresponding to the pivot post;
a positioning member secured to the base, establishing travel limits for the rotatable actuation member, and providing force onto the engagement member, urging the engagement member toward the article; and
wherein rotation of the rotatable actuation member slides the engagement member along the channel of the base thereby securing the article by the force provided by the positioning member;
a frame for securing the article; and
a plurality of support pads positioned in the frame;
wherein the frame and the plurality of support pads restrain movement of the article in at least four directions; and
wherein rotation of the rotatable actuation member of one or more of the at least two apparatuses restrains movement of the article in at least a fifth and sixth direction.

9. The carrier of claim 8, wherein the rotatable actuation member of the at least two apparatuses further comprises a first pin and a second pin, the first pin being configured for actuation and the second pin being configured for urging the engagement member upon the first pin being actuated.

10. The carrier of claim 9, wherein the first pin is of sufficient length for external actuation.

11. The carrier of claim 9, wherein the first pin and the second pin are pressed and welded to the rotatable actuation member.

12. The carrier of claim 8, wherein the actuation of the rotatable actuation member of the first apparatus produces a detenting effect.

13. The carrier of claim 12, wherein reverse rotation of the actuated rotatable actuation member slides the engagement member in the channel of the base away from the article thereby releasing the article.

14. The carrier of claim 8, wherein the engagement member of the first apparatus has a thermal conductivity of less than about 10 W/mk.

15. A method of securing an article, the method comprising:
providing an apparatus, the apparatus comprising:
a base having a channel and a pivot post;
an engagement member for selectively engaging the article, the engagement member being slidably positionable in the channel of the base;
a rotatable actuation member having a pivot feature corresponding to the pivot post; and
a positioning member secured to the base, establishing travel limits for the rotatable actuation member, and providing force onto the engagement member, urging the engagement member toward the article; and
wherein rotation of the rotatable actuation member slides the engagement member in the channel of the base thereby securing the article by the force provided by the positioning member; actuating the rotatable actuation member;
rotating the rotatable actuation member to slide the engagement member in the channel to engage the article; and
wherein the positioning member urges the engagement member toward the article.

16. The method of claim 15, wherein the rotatable actuation member further comprises a first pin and a second pin, the first pin being configured for actuation and the second pin being configured for urging the engagement member upon the first pin being actuated.

17. The method of claim 16, wherein the actuation is robotic actuation.

18. The method of claim 15, further comprising laterally adjusting pads to align and support the article.

19. The method of claim 15, further comprising producing a detenting effect by the actuation of the rotatable actuation member.

20. The method of claim 19, further comprising releasing the article by reverse rotation of the actuated rotatable actuation member.

* * * * *